United States Patent

Arita et al.

[15] 3,658,610

[45] Apr. 25, 1972

[54] MANUFACTURING METHOD OF SEMICONDUCTOR DEVICE

[72] Inventors: Shigeru Arita, Sakai-shi; Ichizo Kamei, Kobe; Tomisaburo Okumura, Kyoto, all of Japan

[73] Assignee: Matsushita Electronics Corporation, Osaka, Japan

[22] Filed: Mar. 20, 1967

[21] Appl. No.: 624,467

[30] Foreign Application Priority Data

Mar. 23, 1966 Japan..................................41/18370

[52] U.S. Cl...................................156/11, 156/17, 148/1.5, 148/175

[51] Int. Cl...........................................H01l 7/00, H01l 7/50

[58] Field of Search........................156/17, 11; 148/1.5, 175

[56] References Cited

UNITED STATES PATENTS

| | | | |
|---|---|---|---|
| 3,372,063 | 3/1968 | Suzuki et al. | 148/1.5 |
| 3,326,729 | 6/1967 | Sigler | 148/175 |
| 3,436,285 | 4/1969 | Wilkes | 156/17 |
| 3,334,281 | 8/1967 | Ditrick | 317/235 |

*Primary Examiner*—Jacob H. Steinberg
*Attorney*—Stevens, Davis, Miller & Mosher

[57] ABSTRACT

A method of pattern-etching a passivation layer on the surface of a semiconductor body by means of the photoresist technique, said passivation layer consisting of laminated two layers, of which the solving speed of the upper layer in an etchant is higher than that of the lower layer; in which the lower layer is formed first, followed by etching into the desired pattern, the upper layer is next formed over the whole surface, then a photoresist film is applied in the identical pattern to the lower one, and finally the area or areas of the upper layer exposed at an opening or openings are etched away, whereby the defect that the upper layer having higher solubility is exclusively side-etched at the periphery of the pattern can be avoided.

4 Claims, 4 Drawing Figures

INVENTORS
SHIGERU ARITA
ICHIZO KAMEI
TOMISABURO OKUMURA
BY Stevens, Davis, Miller & Mosher
ATTORNEYS

MANUFACTURING METHOD OF SEMICONDUCTOR DEVICE

The present invention relates to a method of manufacturing a semiconductor device employing the photoresist technique, and more particularly to a precise pattern etching process employed in the manufacture of the semiconductor device.

In the manufacturing process of a semiconductor device, the upper surface of a semiconductor wafer is often coated with an oxide film, and then openings for forming impurity diffused regions or attaching electrodes are formed in the oxide film by employing the photoresist technique. Sometimes phosphorus is diffused from the outer surface into such an oxide film by subjecting it to a heat treatment in an oxygen or nitrogen atmosphere containing phosphorus for improving the characteristics of and stabilizing the semiconductor device. Such a phosphorus containing oxide film is greater in its solubility in an ordinary etchant than a pure oxide film. When a low solubility oxide film and a phosphorus containing high solubility oxide film laminated thereon are subjected to a selective solution by means of the photoresist technique, the phosphorus containing high solubility oxide film is specifically apt to undergo side-etching, or, in other words, apt to undergo etching in a direction parallel to the wafer.

It is an object of the present invention to provide a method of applying a pattern etching with precision to a lamina composed of a layer of a material which etches at a low speed and another layer of a material which etches at a high speed in the manufacturing process of a semiconductor device in which the photoresist technique is employed.

According to the present invention, there is provided a method of manufacturing a semiconductor device having on one surface thereof two laminated insulating oxide layers with at least one opening formed therein in a desired pattern by etching, the solution velocity of the upper layer of the said laminated layers in an etchant being higher than that of the lower one, comprising the steps of providing the said lower layer on the said one surface of the said device in the said pattern, providing the said upper layer entirely over the said lower layer and the exposed area of the said one surface, providing a photoresist film on the said upper layer in the same pattern as the said pattern of the said lower layer in registered relationship therewith, and etching off the exposed area of the said upper layer with the said etchant.

Other objects and features of the present invention will become apparent from the following detailed description of the invention with reference to the accompanying drawings, in which:

FIGS. 1 to 4 illustrate a series of steps of the manufacturing method of a semiconductor device according to the present invention.

Figure 1:
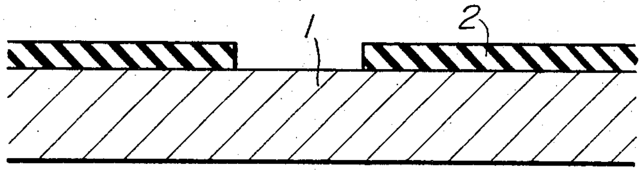

Now, referring to the drawings, in producing a pattern of a layer 2 of a material which etches at a low speed and a layer 3 of another material which etches at a high speed laminated thereon in the same configuration on a semiconductor wafer 1, the layer 2 of the slowly etchable material is first deposited or grown on a predetermined pattern portion on the surface of the wafer 1. To accomplish this process, the layer of material which slowly etches is deposited or grown over the entire surface of the wafer 1. After this, the layer of the material, except the predetermined portion, is removed by way of a selective etching method utilizing the photoresist technique. In this way, the pattern as shown in FIG. 1 may be obtained.

Figure 2:
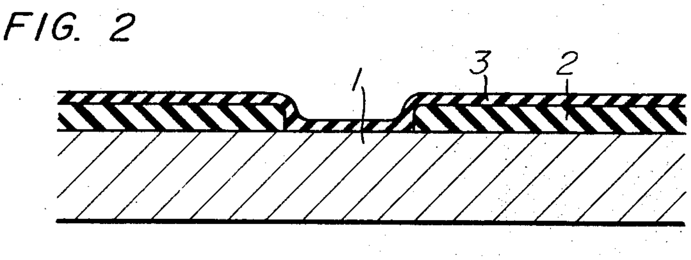
Figure 3:
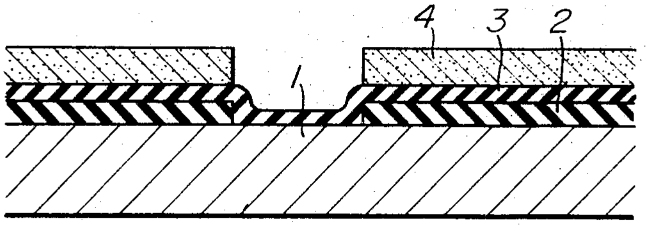
Figure 4:
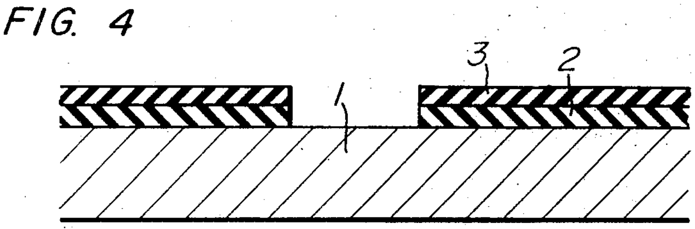

Next, the layer 3 of the quickly etchable material is deposited or grown on the afore-mentioned layer of slowly etchable material and the exposed surface of the wafer 1 as shown in FIG. 2. As an alternative, a part of the slowly etchable material and the wafer are transformed into the quickly etchable material. Then, a photoresist layer 4 is formed exactly in the same pattern as that of the layer 2 as shown in FIG. 3. Thereafter, only the portion of the layer 3 of the quickly etchable material lying in close contact with the wafer and exposed at the opening in the photoresist layer 4 is etched, and finally, the photoresist layer 4 is removed, thereby obtaining the desired pattern with precision as shown in FIG. 4.

EXAMPLE 1

A P-type silicon single-crystalline wafer having a resistivity of 500 Ω-cm was heated at 1,200° C. for 2.5 hours in a dry oxygen atmosphere, producing a clean silicon dioxide film of a thickness of about 0.3$\mu$ on the silicon wafer. This silicon dioxide film was removed leaving the desired area by the photoresist technique. Then, as this wafer was heated in an oxygen atmosphere containing oxides of phosphorus, phosphorus diffused into the silicon dioxide film, and the film part extending from the surface to about 0.05 micron under the surface was transformed into the phosphorus containing silicon dioxide. This layer is quickly etchable. A part of the silicon exposed at the opening portion where the silicon dioxide film was removed, was converted into a thin silicon dioxide film of about 0.07 micron containing phosphorus while being heated in this phosphorus containing oxygen atmosphere.

The desired mask was provided on these layers by using a photoresist solution, e.g., the marketed KPR type solution of Kodak Company. Then, this masked wafer was etched by using the so-called P etch solution made up of 15 parts by volume of hydrofluoric acid, 10 parts of nitric acid and 300 parts of water in admixture.

According to the conventional method, both layers are simultaneously etched with the P etch solution through the opening portion of the mask. The etching with the P etch solution proceeds at a speed of about 600 Angstroms per second through the silicon dioxide containing phosphorus, and 2 Angstroms per second through the clean silicon dioxide. Therefore, while the etching of the clean silicon dioxide is continued after the completion of the initial etching of the phosphorus containing silicon dioxide film, the side-etching of the silicon dioxide film containing phosphorus held between the photoresist film and the clean silicon dioxide film takes place markedly. For example, while the silicon dioxide film containing no phosphorus is being etched by about 0.25 micron, the silicon dioxide film containing phosphorus is side-etched as deep as about 75 microns.

However, when only the silicon dioxide of the thickness of about 0.07 micron containing phosphorus which was transformed from silicon and which was exposed at the opening portion of the mask was removed in the course of this process by using the photoresist technique in accordance with the method of the present invention, the side-etching of the silicon dioxide containing phosphorus which is covered by the photoresist proceeded only to the extent of about 0.07 micron, thereby resulting in an exceedingly good etching accuracy.

EXAMPLE 2

On an N-type silicon single-crystalline wafer having a resistivity of 20 Ω-cm was deposited a clean silicon dioxide film of a thickness of about 0.5 micron by the pyrolysis of organo-oxysilane, and further on the surface thereof was deposited a silicon dioxide film containing boron of a thickness of about 0.1 micron by the pyrolysis of boron doped organo-oxysilane.

These layers were etched with the P etch solution according to the method of this invention and also the conventional method. While through the clean silicon dioxide, the etching with the P etch solution proceeded at a speed of about 2 Angstroms per second, through the silicon dioxide containing boron, the speed was about 30 Angstroms per second. In the conventional method, accordingly, when the pattern etchings of the silicon dioxide film containing boron and the clean silicon dioxide film were simultaneously carried out, the amount of the side-etching of the silicon dioxide film undergone during the time when the clean silicon dioxide film was being etched to a depth of 0.5 micron was about 7.5 micron.

When, however, the manufacturing method of semiconductors of this invention was used, the side-etching of the aforementioned silicon dioxide film containing boron undergone during the time when the silicon dioxide film of the thickness of 0.1 micron containing boron was being etched away advanced to a depth of only about 0.1 micron with a fairly accurate result.

In the examples mentioned above, the semiconductor device had only two layers etchable at different speeds. However, the use of this invention is not limited to the double layer only. For example, with the semiconductor devices wherein more than two layers of materials of successively increasing etching speeds are laminated, an improvement in etching accuracy can be achieved by repeatedly applying the method of the invention.

In the above, although the description has been made referring to films of silicon oxide by way of explanation, the present invention can likewise be applicable to insulator films of such as silicon nitride, magnesium fluoride, etc., metal films, and electroconductive films such as Nesa (trademark of Pittsburgh Plate Glass Co. for a transparent conductive coating) films, the principal component thereof being $SnO_2$.

What is claimed is:

1. A method for manufacturing a semiconductor device of the type comprising a semiconductor body upon one surface of which are attached a plurality of superimposed layers of insulating oxide materials, an upper layer of which is more rapidly soluble in an etchant than is a next lower layer, and further comprising an etched out pattern extending through both said layers thereby exposing said body surface in correspondence with the configuration of said pattern, said method comprising the steps of:

a. depositing a layer of silicon dioxide on said semiconductor body to form said lower layer;
b. providing a said pattern through the thickness of said lower layer;
c. forming said upper layer over said pattern by heating said silicon dioxide layer in the presence of phosphorous to form phosphorous oxides;
d. applying a photoresist film on said mixed oxide layer excepting that portion thereof which covers said pattern;
e. etching away that portion of said mixed oxide layer covering said pattern with an etching solution containing hydrofluoric acid as its principal constituent; and,
f. finally removing said photoresist film.

2. The method of claim 1, wherein said body is a silicon single-crystalline wafer, said wafer being heated in an oxygen atmosphere so as to form a lower layer of clean silicon dioxide thereon, said pattern being then formed in said lower layer, the wafer then being heated in an oxygen atmosphere containing phosphorous oxides so as to form an upper layer of phosphorous containing silicon dioxide over said first layer and over said pattern, applying a photoresist solution over said upper layer excepting for the portion thereof covering said pattern; then etching away said upper layer portion.

3. The method of claim 2, wherein said wafer is heated in said dry oxygen atmosphere at a temperature and for a period of time so as to produce a lower layer of clean silicon dioxide which is substantially 0.3 micron, and said upper layer is formed to a thickness of substantially 0.05 micron thick over said first layer.

4. A method for manufacturing a semiconductor device of the type comprising an N-type semiconductor body upon one surface of which are attached a plurality of superimposed layers of insulating oxide materials, an upper layer of which is more rapidly soluble in an etchant than is a next lower layer, and further comprising an etched out pattern extending through both said layers thereby exposing said semiconductor body surface in correspondence with the configuration of said pattern, said method comprising the steps of:

a. forming a first layer on said semiconductor body by the pyrolysis of organo-oxysilane;
b. providing a said pattern through the thickness of said first layer;
c. forming a second layer over said pattern by the pyrolysis of boron doped organo-oxysilane;
d. applying a photoresist film over said second layer excepting that portion thereof which covers said pattern;
e. etching away that portion of said second layer covering said pattern with an etching solution containing hydrofluoric acid as its principal constituent; and
f. finally removing said photoresist film.

* * * * *